(12) United States Patent
Haddad et al.

(10) Patent No.: US 6,172,914 B1
(45) Date of Patent: Jan. 9, 2001

(54) CONCURRENT ERASE VERIFY SCHEME FOR FLASH MEMORY APPLICATIONS

(75) Inventors: Sameer S. Haddad, San Jose; Colin Bill, Cupertino; Michael Van BusKirk, Saratoga, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/404,078

(22) Filed: Sep. 23, 1999

Related U.S. Application Data

(60) Provisional application No. 60/148,778, filed on Aug. 13, 1999.

(51) Int. Cl.[7] .................................................. G11C 16/04
(52) U.S. Cl. .................................. 365/185.29; 365/185.33
(58) Field of Search ........................ 365/185.01, 185.03, 365/185.18, 185.21, 185.24, 185.26, 185.29, 185.33, 218

(56) References Cited

U.S. PATENT DOCUMENTS

| | | | |
|---|---|---|---|
| 5,233,562 | * | 8/1993 | Ong et al. ........................ 365/185.24 |
| 5,905,674 | * | 5/1999 | Choi ................................ 365/185.01 |
| 6,011,721 | * | 1/2000 | Sunkavalli ...................... 365/185.21 |

\* cited by examiner

*Primary Examiner*—Trong Phan
(74) *Attorney, Agent, or Firm*—H. Donald Nelson

(57) ABSTRACT

A method for sensing the state of erasure of a flash (EEPROM) memory device. In one embodiment, the source voltage during erase is monitored and compared to a value determined during a characterization procedure. In a second embodiment, the rate of change of the source voltage during erase is determined and compared to a value determined during a characterization procedure. The characterization procedure correlates state of erasure with source voltages and slopes of the rate of change of source voltage versus time curve for the memory cells. The determination of the source voltage and the determination of the rate of change of the source voltage and the associated state of erasure allows modification of the erase procedure.

11 Claims, 6 Drawing Sheets

CONCURRENT ERASE VERIFY SCHEME FOR FLASH MEMORY APPLICATIONS

This Appln claim the benefit of U.S. Provisional No. 60/148,778 filed Aug. 13, 1999.

BACKGROUND OF THE INVENTION

1. Field of the Invention

This invention relates generally to the art of microelectronic integrated circuits. More specifically, this invention relates to a method to monitor the state of erasure of a flash Electrically Erasable Programmable Read Only Memory (EEPROM) device during erase of the memory device. Even more specifically, this invention relates to a method to monitor the state of erasure of a flash Electrically Erasable Programmable Read Only Memory (EEPROM) device by monitoring the source voltage and by monitoring the rate of change of the source voltage during erase of the memory device.

2. Discussion of the Related Art

A microelectronic Electrically Erasable Programmable Read-Only Memory (Flash EEPROM) device includes an array of cells that can be independently programmed and read. The size of each cell and thereby the memory device are made small by omitting select transistors that would enable the cells to be erased independently. As a result all of the cells must be erased simultaneously as a block.

A memory of this type includes individual Metal-Oxide-Semiconductor (MOS) field effect transistor memory cells, each of which includes a source, drain, floating gate and control gate to which various voltages are applied to program the cell with a binary "1" or "0" or to erase all of the cells as a block.

The cells are connected in a rectangular array of rows and columns, with the control gates of the cells in a row being connected to a respective wordline and the drains of the cells in a column being connected to a respective bitline. The sources of the cells are connected together to a common source. This arrangement is known as a NOR memory configuration.

A cell is programmed by applying typically 9 volts to the control gate, 5 volts to the drain and grounding the source, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

The cell is read by applying typically 5 volts to the control gate, 1 volt to the bitline to which the drain is connected, grounding the source, and sensing the bitline current. If the cell is programmed and the threshold voltage is relatively high ($\approx 4$ volts), the bitline current will be zero or at least relatively low. If the cell is not programmed or erased, the threshold voltage will be relatively low ($\approx 2$ volts), the control gate voltage will enhance the channel, and the bitline current will be relatively high.

A cell can be erased in several ways. In one arrangement, applying typically 12 volts to the source, grounding the control gate and allowing the drain to float erases a cell. This causes the electrons that were injected into the floating gate during programming to be removed by Fowler-Nordheim tunneling from the floating gate through the thin tunnel oxide layer to the source. Alternatively, applying a negative voltage on the order of minus 10 volts to the control gate, applying 5 volts to the source and allowing the drain to float can erase a cell.

Another arrangement for erase is to use a constant current erase method. In the constant current erase method, a constant current is forced into the common source while applying a negative voltage on the order of minus 10 volts to the control gate and allowing the drain to float. The object of this arrangement is to provide a constant tunnel oxide field by maintaining a constant band-to-band tunneling current. During erase the source pulls up to a given voltage to maintain the required tunnel oxide field to sustain the constant band-to-band electric field. As electrons are removed from the floating gate of the cells by Fowler-Nordheim tunneling through the tunnel oxide, the vertical field across the tunnel oxide decreases and the source voltage will rise to a higher voltage to maintain the tunnel oxide field.

FIG. 2A illustrates a source pull-up power supply 200 that includes a constant current source 202. The constant current source 202 is connected to a voltage power supply $V_{SS}$ 204. A load line for the power supply 200 is illustrated in FIG. 2B, which plots source current $I_S$ as a function of source voltage $V_S$. The current source 202 supplies a constant current of value $I_S$MAX and limits the maximum voltage to $V_S$MAX. The improvement provided by the constant current erase will be maintained as long as the source voltage $V_S$ is lower than $V_S$MAX FIG. 3 illustrates the effect of cycling in which the curve 300 represents the source pull up voltage in crease during the first erase cycle. The curve 302 represents the source pull up voltage characteristic at the end of several erase of cycles showing the effect of cycling. It will be noted that the curve 302 is above the curve 300, and that the source voltage $V_S$ can become clamped to the limit value $V_{SS}$ along the curve 302 long before the cells have become completely erased.

The cycling phenomenon is caused by the generation of hot electron-hole pairs resulting from band-to-band tunneling. Whereas Fowler-Nordheim tunneling from the floating gate through the tunnel oxide layer to the source results in erasure of a cell, band-to-band tunneling also occurs between the substrate and the source. When a positive voltage is applied to the source junction with the control gate negative, a deep depletion region is formed underneath the gate-to-source overlap region. The tunneling of valence band electrons into the conduction b and generates electron-hole pairs. The source junction collects the electrons and the holes are collected by the substrate.

Since the minority carriers (holes) generated thermally or by band-to-band tunneling in the source region flow to the substrate due to the lateral field near the Si-SiO$_2$ interface, the deep depletion region remains present and the band-to-band tunneling can continue without creating an inversion layer. The generated holes gain energy because of the electric field in the depletion region. While the majority of these generated holes flow into the substrate, some of them gain sufficient energy to surmount the Si-SiO$_2$ barrier and are trapped in the tunnel oxide layer. The trapped holes reduce the electric field that results in reduced band-to-band tunneling current. This effect causes the junction to "walk-out" the source voltage and under constant current erase the source voltage increases to offset the reduction in the band-to-band electric field, which speeds up the erase (less number of erase pulses are required to complete the erase).

Therefore it is desirable to monitor the erase state of the memory in order to determine how far the erase operation has progressed and how many more erase pulses need to be applied.

As illustrated in FIG. 3, the main contribution to the source current $V_S$ is band-to-band tunneling (the Fowler-Nordheim tunneling current that causes the actual cell erasure is orders of magnitude lower), and this generally provides an accurate indication of the erase state. It is therefore possible to monitor the erase state of the memory by sensing the source voltage during erase. Also because the shape of the curves 300 and 302 are the same, it is also possible to monitor the erase state of the memory by sensing the rate of change of the source voltage during erase.

Therefore, what is needed is a method to monitor the state of erase by sensing the source voltage and/or the rate of change of the source voltage, wherein the method is independent of the effects of cycling.

SUMMARY OF THE INVENTION

According to the present invention, the foregoing and other objects and advantages are achieved by a device and method of sensing a state of erasure of a flash Electrically-Erasable Programmable Read Only Memory (EEPROM). The common source voltage of the memory cells being erased is monitored during erase procedure and the rate of change of the source voltage is determined. The source voltage and the rate of change of the source voltage are compared to values determined during a characterization procedure for the specific memory device.

In accordance with another aspect of the invention the erase procedure is modified when either the source voltage or the rate of change of the source voltage matches a value determined during the characterization procedure. The modification of the erase procedure can be to stop the erase procedure, to change the parameters of the erase procedure or to determine the number of erase pulses needed to complete the erase.

In accordance with another aspect of the invention a source voltage versus erase time curve is determined during the characterization procedure. The slopes of the source voltage versus erase time curve are correlated to states of erasure of the memory cell during the characterization procedure.

In accordance with another aspect of the invention a monitor senses the source voltage, determines the rate of change of the source voltage and communicates with a control element that modifies the erase procedure.

The described method and device thus provides a method of monitoring the state of erasure of a flash memory device that is independent of cycling effects on the memory cells.

The present invention is better understood upon consideration of the detailed description below, in conjunction with the accompanying drawings. As will become readily apparent to those skilled in the art from the following description, there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to a specific embodiment of the present invention that illustrates the best modes presently contemplated by the inventors for practicing the invention.

Figure 1A:
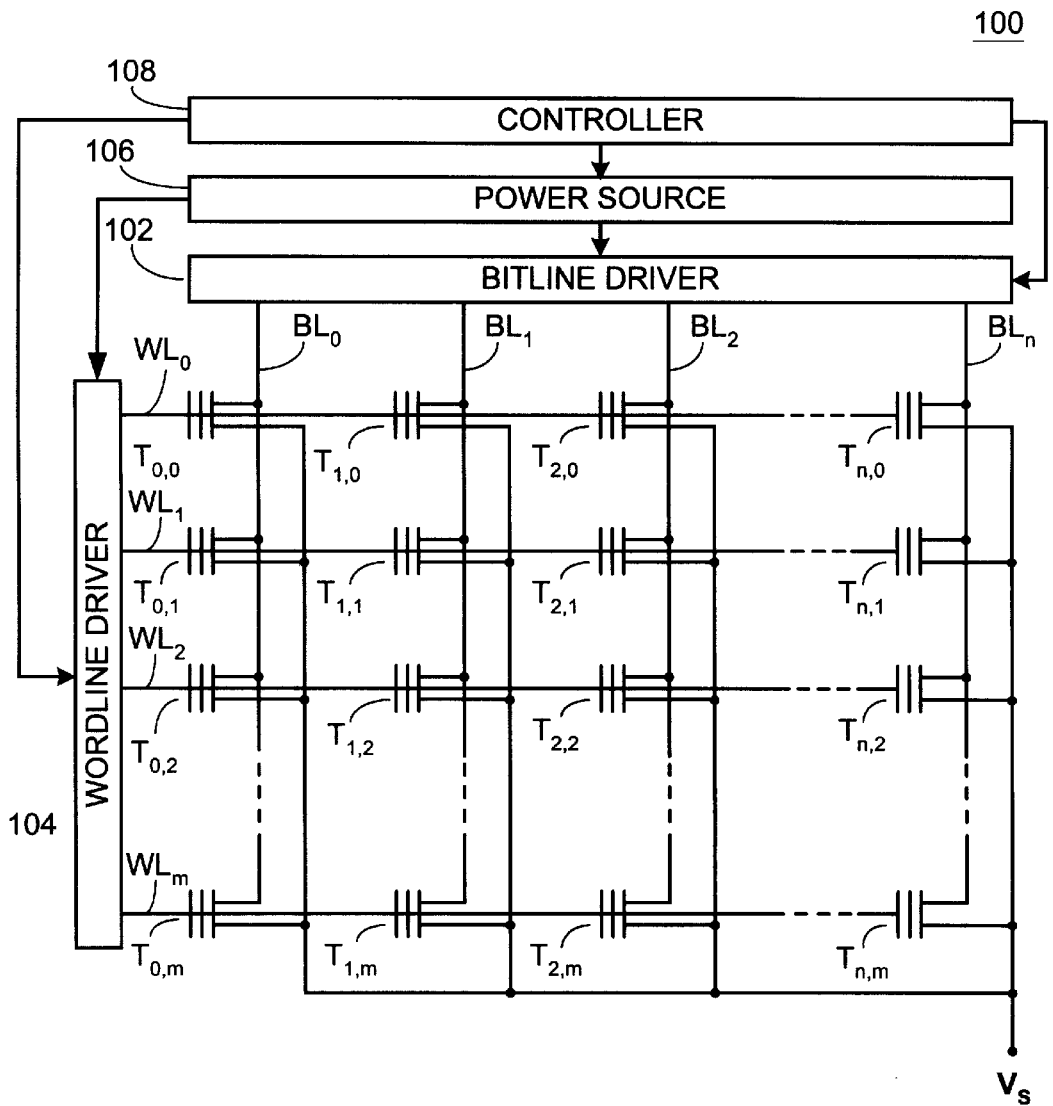
FIG. 1A is a simplified electrical schematic diagram of a flash EEPROM showing an array of memory cells and control elements.

FIG. 1A illustrates the basic configuration of a NOR type flash Electrically Erasable Programmable Read-any Memory EEPROM device 100 to which the present invention is advantageously applied. The memory device 100 is a plurality of core or memory cells that are arranged in a rectangular matrix or array of rows and columns. Each row is associated with a wordline, whereas each column is associated with a bitline. The sources of all of the memory cells are connected to a common terminal, $V_S$.

Assuming that there are n columns and m rows, the bitlines are designated $BL_0$ to $BL_n$ and the wordlines are designated as $WL_0$ to $WL_m$. A bitline driver 102 applies appropriate voltages to the bitlines, whereas a wordline driver 104 applies appropriate voltages to the wordlines. The voltages applied to the drivers 102 and 104 are generated by a power source or supply 106 under the control of a controller 108 that is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field-Effect-Transistor (FET) having a source, drain, gate oxide and control gate. The cells of a flash EEPROM differ from conventional FETs in that they additionally include a floating gate and tunnel oxide layer disposed underneath the control gate.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the common terminal $V_S$, which is connected to the power supply 106. The connection to the power supply 106 is not shown.

Programming a cell is achieved by applying typically 9 volts to the control gate of the cell, applying typically 5 volts to the drain of the cell and grounding the source of the cell, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

The cell is read by applying typically 5 volts to the control gate of the cell, applying 1 volt to the bitline to which the drain of the cell is connected, grounding the source of the cell, and sensing the bitline current. If the cell is programmed and the threshold voltage is relatively high ($\approx$4 volts), the bitline current will be zero or at least relatively low. If the cell is not programmed or erased, the threshold voltage will be relatively low ($\approx$2 volts), the control gate voltage will enhance the channel, and the bitline current will be relatively high. Reading is preferably performed using sense amplifiers and a reference current array, the details of which are not the particular subject matter of the present invention.

A cell can be erased in several ways. In one arrangement, applying typically 12 volts to the source of the cell, grounding the control gate of the cell and allowing the drain of the cell to float erases the cell. These voltages cause the electrons that were injected into the floating gate of the cell during programming of the cell to be removed by Fowler-Nordheim tunneling from the floating gate of the cell through the thin tunnel oxide layer to the source of the cell. Alternatively, applying a negative voltage on the order of minus 10 volts to the control gate of the cell, applying 5 volts to the source of the cell and allowing the drain of the cell to float can also erase a cell.

Figure 1B:
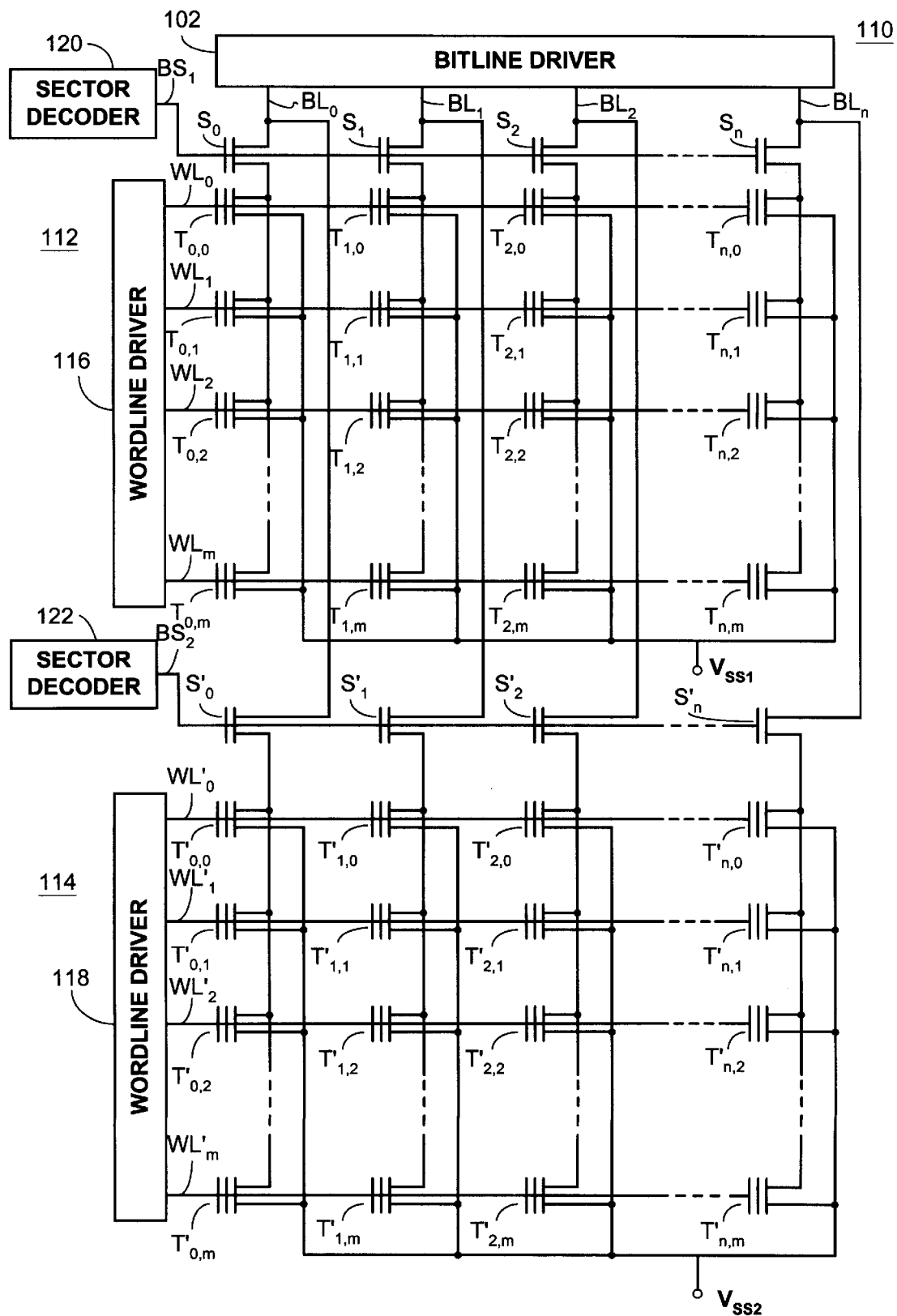
FIG. 1B is similar to FIG. 1A and illustrates a flash EEPROM having arrays memory cells arranged in pages or banks.
Figure 2A:
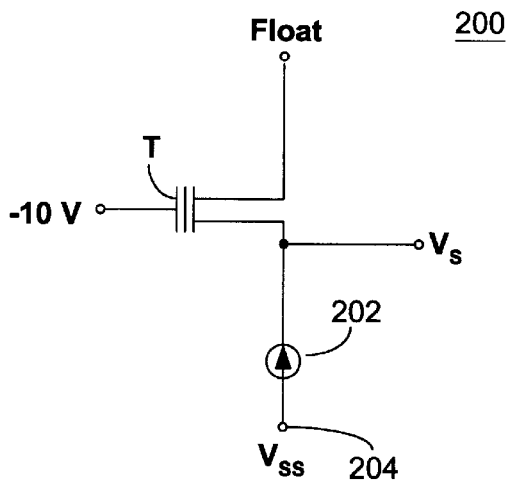
FIG. 2A is a fragmentary electrical schematic diagram illustrating a constant current power supply applying a source voltage to a memory cell.
Figure 2B:
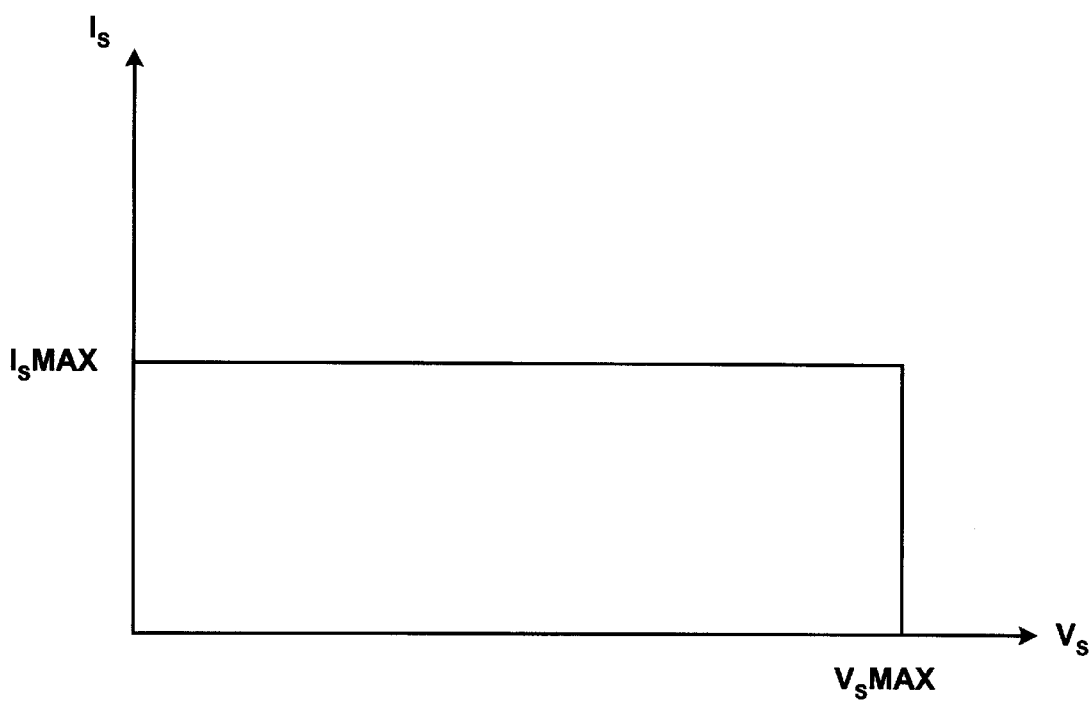
FIG. 2B is a graph illustrating a load line of the power supply shown in FIG. 2A.

It is common to organize the individual memory cells of a flash EEPROM into a plurality of banks or sectors. FIG. 1B illustrates a flash EEPROM memory device 110 that is similar to the memory device 100 except that the memory cells are divided into banks. In FIG. 1B the memory cells are shown divided into two banks (also known as pages or sectors), each of which can be programmed, erased and read independently. A typical EEPROM memory device can comprise, for example 8 sectors, each of which includes 512 K memory cells. For simplicity of illustration and description, the memory device 110 is shown as including only a first memory cell bank 112 and a second memory cell bank 114. However, it will be understood that the present invention is applicable to a memory device having any number of sectors or banks. The memory device 110 also includes a controller and a power source or supply similar to the memory device 100, although they are not explicitly illustrated.

The memory cells in the first bank 112 are designated in the same manner as in FIG. 1A, whereas a prime symbol is added to the designations of the elements in the second bank 114. The wordlines of the banks 112 and 114 are connected to separate wordline drivers 116 and 118, respectively. In addition to the memory cells, each of the banks 112 and 114 includes a select transistor for each bitline. The select transistors for the banks 112 and 114 are designated $S_0$ to $S_n$ and $S_0'$ to $S_n'$, respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors function as switching elements rather than as memory elements. The gates of the select transistors for the bank 112 are connected to a bank select output $BS_1$ of a sector decoder 120, whereas the gates of the select transistors for the bank 114 are connected to a bank select output $BS_2$ of a sector decoder 122. The sources of the cells in bank 112 are connected to a common source supply voltage $V_{SS1}$, whereas the sources of the cells in the bank 114 are connected to a common source supply voltage $V_{SS2}$.

The bank 112 is selected by applying a logically high signal to the bank select line $BS_1$, which turns on the transistors $S_0$ to $S_n$ and connects the bitlines $BL_0$ to $BL_n$ to the underlying memory cells. The bank 112 is deselected by applying a logically low signal to the bank select line $BS_1$, which turns off the transistors $S_0'$ to $S_n'$, and disconnects the memory cells from the bitlines. The bank 114 is selected and deselected in an essentially similar manner using the bank select signal $BS_2$ and select transistors $S_0'$ to $S_n'$. The operation of the memory 110 is essentially similar to that of the memory 100 (FIG. 1A), except that the program, erase and read operations are performed on the banks 112 and 114 independently.

Figure 3:
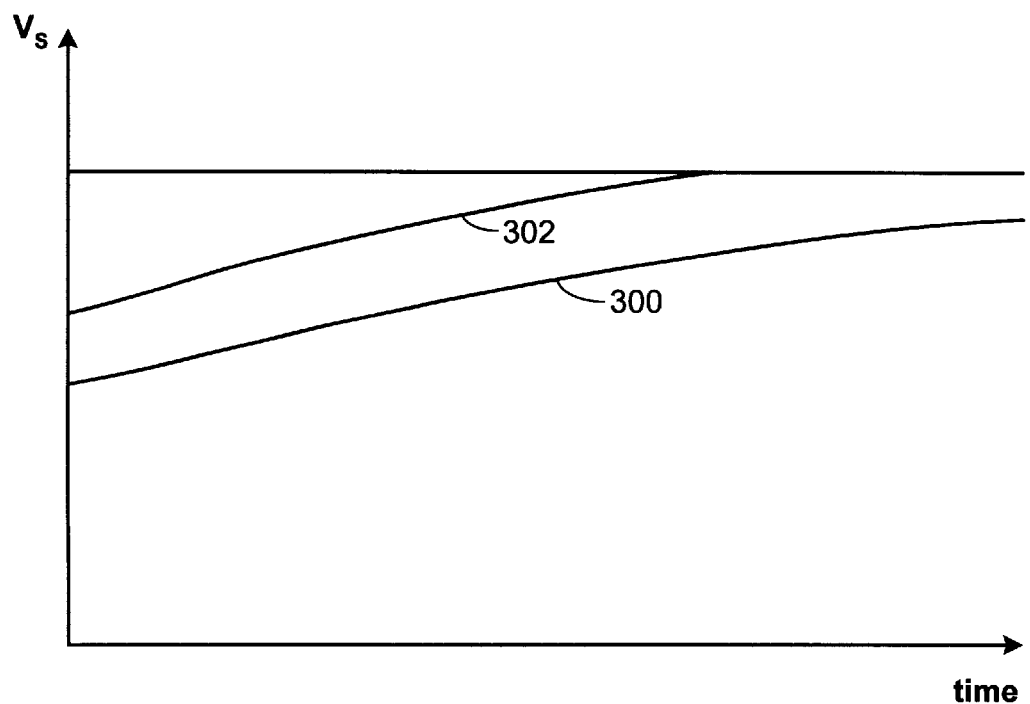
FIG. 3 is a graph illustrating how the source voltage clamps to a maximum value due to cycling as an erase procedure progresses.
Figure 4:
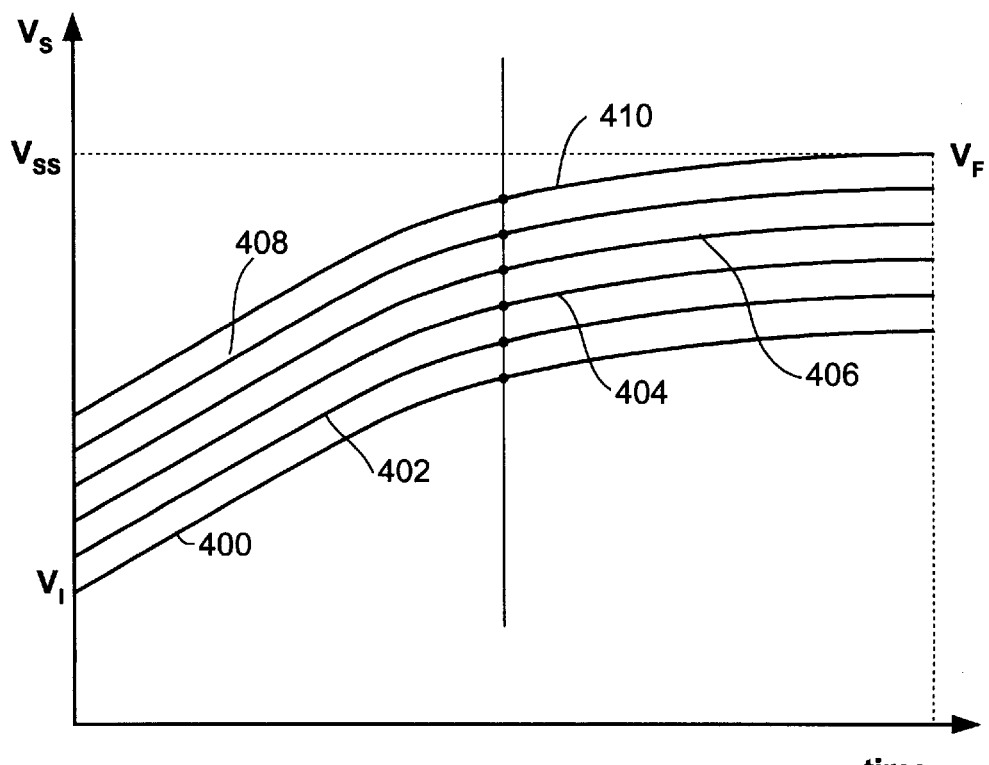
FIG. 4 is a graph illustrating how the source voltage increases due to cycling.

FIG. 4 illustrates the effects of cycling as described above in conjunction with FIG. 3, but with the source drive current low enough that the source voltage will not reach and be clamped to $V_{SS}$. A curve 400 illustrates the initial variation of source voltage with time (equivalently the number of applied erase pulses) that would hold if cycling were not present. The source voltage has an initial value $V_1$ where the curve 400 intersects the $V_S$ axis. Curves 402, 404, 406, 408, and 410 illustrate how the variation of source voltage with time is progressively shifted due to the effects of cycling, with the curve 410 representing the relationship at the finish of the erase operation after numerous cycles. The final value of source voltage is $V_F$, as indicated at the end of the curve 410. The shift of the curves 402 through 410 is termed "walk-out" and is due mainly to charge trapping in the oxide layer under the floating gate.

If the source voltage is maintained at a very low value, the effect of cycling will be reduced and the final curve will not differ greatly from the initial curve. In such a case, the state of erasure of the memory will substantially correspond to the curve 400.

Figure 5:
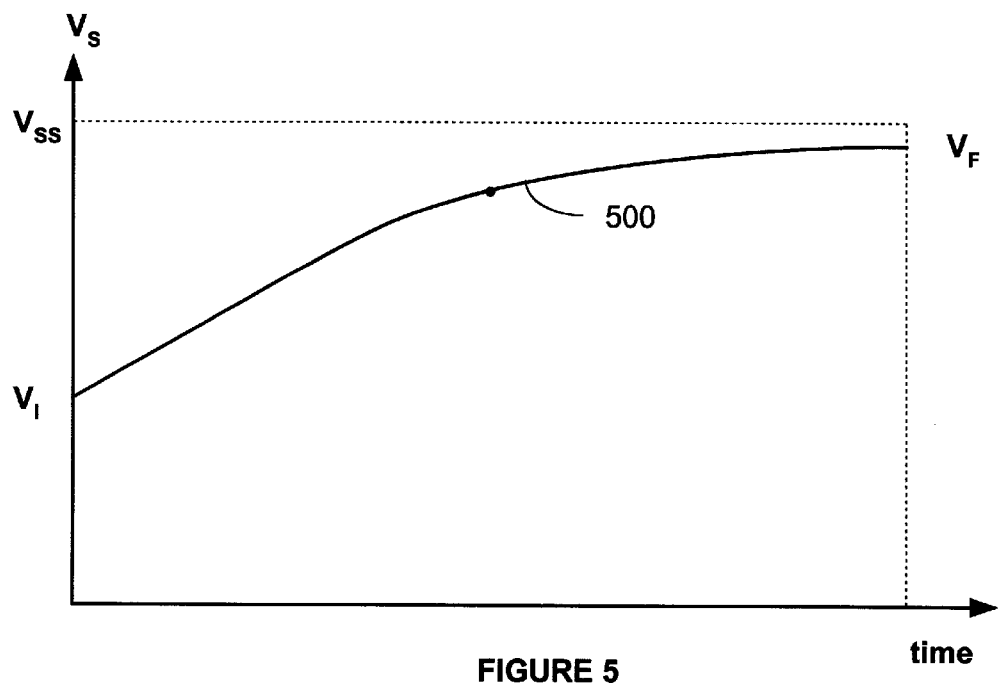
FIG. 5 is a graph illustrating how the source voltage increases as a function of time.

However, in some applications it will not be practical to maintain the source voltage applied during the monitoring pulses at such a low value, and the source voltage curve will be shifted due to cycling as illustrated in FIG. 4. The result is that the source voltage $V_S$ will vary with time as illustrated by the curve 500 (FIG. 5), starting at the initial value $V_I$ and ending at the final value $V_F$. The entire source voltage versus erase time curve shifts upwardly with cycling. Since the sources of the cells are connected together while the erase and monitoring pulses are applied, the sensed source voltage represents an average value for all of the cells or represents the source voltage for a typical cell. Because the sensed source voltage represents the average value of all the cells, the sensed source voltage represents the state of erasure of the main body of the cells in the memory. As can be appreciated, the difficulty is to know where in the matrix of the curves 400 through 410 (FIG. 4) when a source voltage is measured. It is noted that the shape of the curves 400 through 410 are substantially the same. The line 412 is drawn through the curves 400 through 410 where the slopes of the curves are the same. The curves 400 through 410 can be kept below the $V_{SS}$ limit if the initial source voltage $V_I$ is selected to be low enough that the curve 410 does not reach the $V_{SS}$ limit. The value of the initial source voltage $V_I$ is determined in the characterization procedure discussed below. The slope of the curves is the rate of change of $V_S$ with erasure time and when that point is reached, the state of erasure would then be determined.

The actual shape of the curve 500 will be different for each specific memory device, however the shape of the curve 500 can be determined empirically or by using a computer simulation in a characterization procedure for the specific memory device. Once the curve is determined, the slope of the curve can be sensed or monitored. Each point on the curve 500 represents a value of sensed source voltage corresponding to a state of erasure as represented by time, number of applied erase pulses or percentage of completion of the erase operation. During the characterization procedure, the relationship between the source voltage or the slope of the curve 500 and the state of erasure of the memory is determined. When a desired state of erasure is reached as indicated by the sensed source voltage and/or the slope of the curve 500, the erase procedure can be modified or terminated. For example, the erase procedure can be modified by changing the voltages applied to the electrodes of the cells or by changing the duration of the voltages applied to the electrodes of the cells. The number of erase pulses to be further applied can also be determined.

In this manner, the present method enables accurate determination of the state of erasure of the memory cells as a predetermined function of the source voltage or as a function of the slope of the curve 500 of the sensed source voltage. The calculation can be performed using logic circuitry, a look-up table, or any other suitable methodology. For example, once the erase state of the memory is determined, the erase parameters can be suitably adjusted to optimize the vertical electric field across the tunnel oxide and thereby tighten the threshold voltage distribution.

Figure 6:
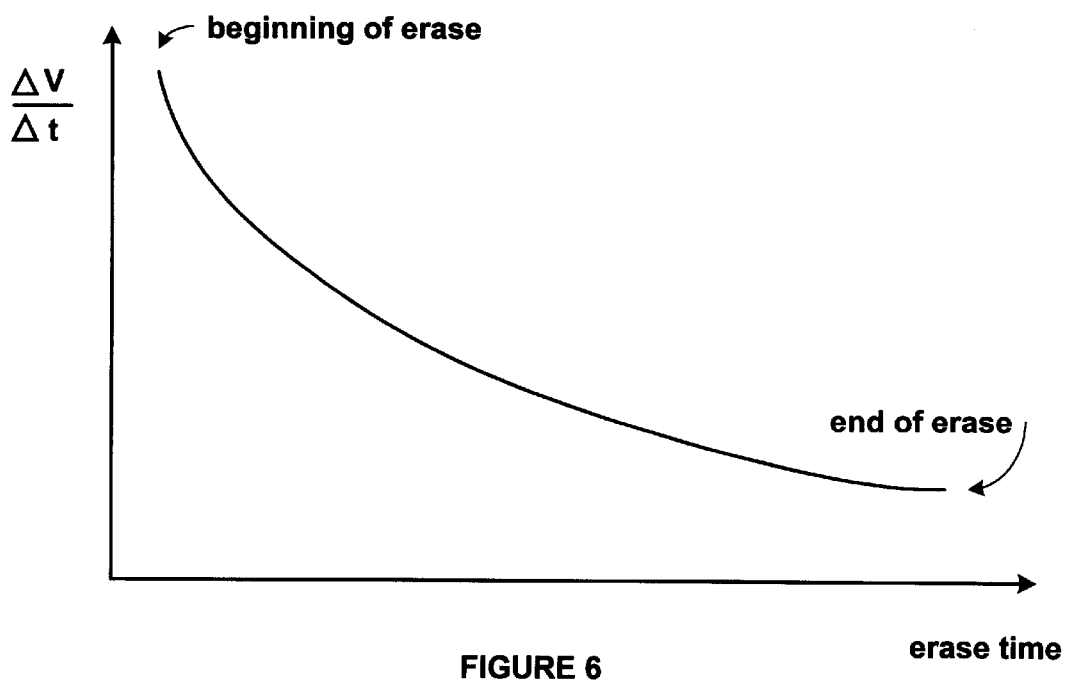
FIG. 6 is a graph illustrating the relationship between the rate of change of source voltage with erase time.

FIG. 6 is a graph illustrating the relationship between the rate of change of the source voltage with erase time from the beginning of erase to the end of erase.

Figure 7:
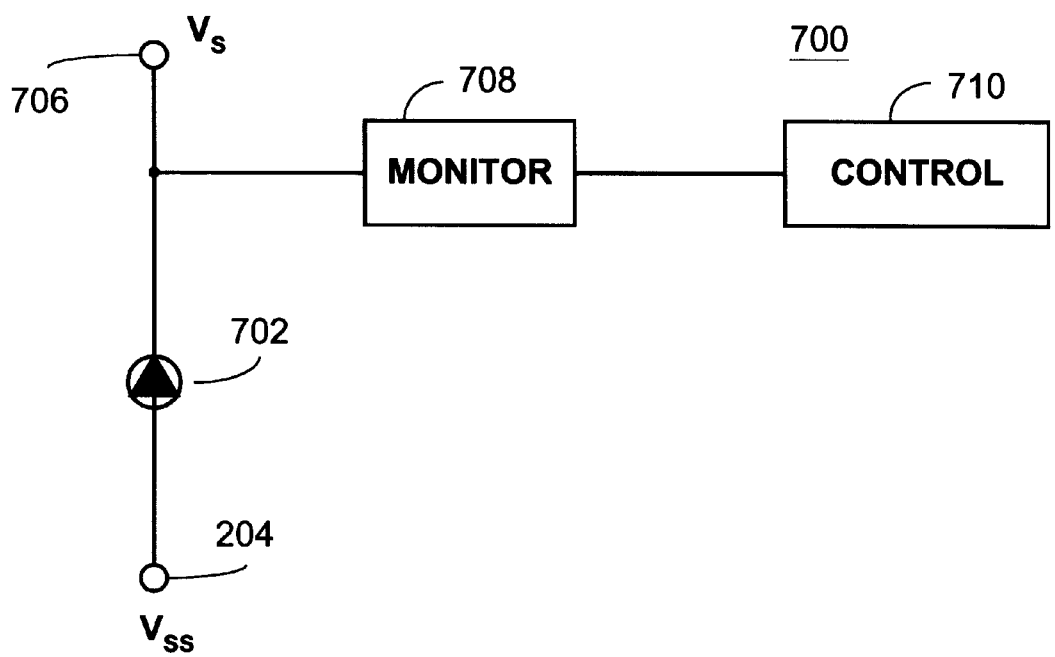
FIG. 7 is fragmentary electrical schematic diagrams illustrating a method of determining the rate of change of the source voltage with erase time.

FIG. 7 illustrates a circuit arrangement 700 for practicing the present invention. It is noted that there are other methods for determining the rate of change of the source voltage with time. As viewed in FIG. 7a constant current source 702 is connected between $V_{SS}$ 204 and the common source terminal $V_S$, indicated at 706. A monitor 708 senses the source voltage at the common source terminal, $V_S$ 206, and determines the rate of change of the source voltage with erase time. This information is input to control 710, which is programmed to modify, stop or adjust the number of remaining erase pulses to be applied during the erase procedure. Either the monitor 708 or the control 710 can be programmed with the appropriate information determined during the characterization procedure discussed above.

In summary, the present invention overcomes the limitations of the prior art and fulfills the need for a method of accurately sensing the state of erasure of a flash EEPROM device that can be advantageously applied to modify the erase procedure, to stop the erase procedure or to determine how many pulses are needed to complete the erase procedure.

The foregoing description of the embodiment of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for sensing a state of erasure of a flash Electrically-Erasable Programmable Read-Only Memory EEPROM) that includes a multitude of field effect transistor memory cells each having a source, drain, floating gate and control gate, the method comprising:

initiating an erase procedure for selected memory cells;

monitoring a voltage at the common source terminal of the selected memory cells during the erase procedure;

determining the rate of change of the voltage at the common source terminal of the selected memory cells during the erase procedure;

comparing the voltage at the common source terminal and the rate of change of the voltage at the common source terminal of the selected memory cells during the erase procedure to a value of a common source voltage and to a value of a rate of change of the rate of change of the voltage at the common source terminal of the selected memory cells during the erase procedure determined during a characterization procedure for the memory cells; and modifying the erase procedure when the voltage at the common source terminal and the rate of change of the voltage at the common source terminal matches values determined during the characterization procedure.

2. The method of claim 1 wherein modifying the erase procedure is selected from stopping the erase procedure, changing parameters of the erase procedure and determining a number of erase pulses required to complete the erase procedure.

3. The method of claim 2 wherein determining a value during a characterization procedure for the memory cells includes characterizing a source voltage versus erase time curve.

4. The method of claim 3 wherein determining a value during a characterization procedure for the memory cells includes correlating slopes of the source voltage versus erase time curve with state of erasure of the memory cells being characterized.

5. The method of claim 4 wherein determining the rate of change of the voltage at the sources of the memorys cells accomplished by monitoring the change of voltage at the common source terminal of the memory cells being erased and dividing by the change of erase time.

6. The method of claim 5 wherein the rate of change of the voltage at the common source terminal of the memory cells being erased is input to a control element that controls the erase procedure of the memory cells.

7. The method of claim 6 wherein modifying the erase procedure is accomplished by the control element.

8. A flash Electrically-Erasable Programmable Read-Only Memory (EEPROM) device, comprising:

multiple memory cells each having a control gate and a floating gate, a source and a drain wherein the sources have a common source terminal;

a monitor to determine a voltage at the common source terminal; and a monitor to determine the rate of change of the source voltage at the common source terminal during an erase procedure.

9. The device of claim 8 wherein the monitor includes circuitry that compares the rate of change of a source voltag at the common source terminal to a value determined during a characterization procedure.

10. The device of claim 9 further comprising a control element and wherein the monitor includes circuitry that communicates with the control element to modify the erase procedure.

11. The device of claim 10 wherein the control element includes circuitry to modify the erase procedure by selecting a modification selected from changing the parameters of the erase procedure, stopping the erase procedure and determining a number of erase pulses required to complete the erase procedure.

* * * * *